United States Patent
Poechmueller

(10) Patent No.: US 6,477,081 B2
(45) Date of Patent: Nov. 5, 2002

(54) INTEGRATED MEMORY HAVING MEMORY CELLS WITH A MAGNETORESISTIVE STORAGE PROPERTY

(75) Inventor: Peter Poechmueller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,223

(22) Filed: Jul. 3, 2001

(65) Prior Publication Data

US 2002/0006061 A1 Jan. 17, 2002

(30) Foreign Application Priority Data

Jul. 3, 2000 (DE) .......................................... 100 32 274

(51) Int. Cl.[7] .............................................. G11C 11/00
(52) U.S. Cl. ....................................... 365/158; 365/200
(58) Field of Search ................................ 365/158, 145, 365/200, 173, 157

(56) References Cited

U.S. PATENT DOCUMENTS

| 5,483,490 | A | 1/1996 | Iwai et al. ................... 365/200 |
|---|---|---|---|
| 5,594,701 | A | 1/1997 | Asaka et al. ............ 365/230.03 |
| 6,038,191 | A | 3/2000 | Fukuhara et al. ............ 365/229 |
| 6,320,804 | B2 * | 11/2001 | Dahn .......................... 365/200 |
| 6,349,053 | B1 * | 2/2002 | Daughton et al. ........... 365/145 |
| 6,388,916 | B1 * | 5/2002 | Johnson ....................... 257/295 |

FOREIGN PATENT DOCUMENTS

| DE | 198 13 504 A1 | 9/1999 |
|---|---|---|
| EP | 0 486 295 A2 | 5/1992 |
| EP | 0 747 824 A1 | 12/1996 |
| WO | WO 99/14760 | 3/1999 |

* cited by examiner

*Primary Examiner*—Richard Elms
*Assistant Examiner*—Hien Nguyen
(74) *Attorney, Agent, or Firm*—Laurence A. Greenberg; Werner H. Stemer; Ralph E. Locher

(57) ABSTRACT

An integrated memory has memory cells with a magnetoresistive storage property. The memory cells are connected in each case between a column line and a row line. The row lines can be connected to a terminal for a selection signal for reading a data signal of one of the memory cells or writing a data signal to one of the memory cells via the column line connected to the memory cell. One or more of the column lines not connected to the memory cell can be driven in such a way that they are electrically isolated in the sense amplifier for reading or writing of the data signal. As a result, even in the case of a defective memory cell, it is possible to properly read from or write to the memory cell.

6 Claims, 1 Drawing Sheet

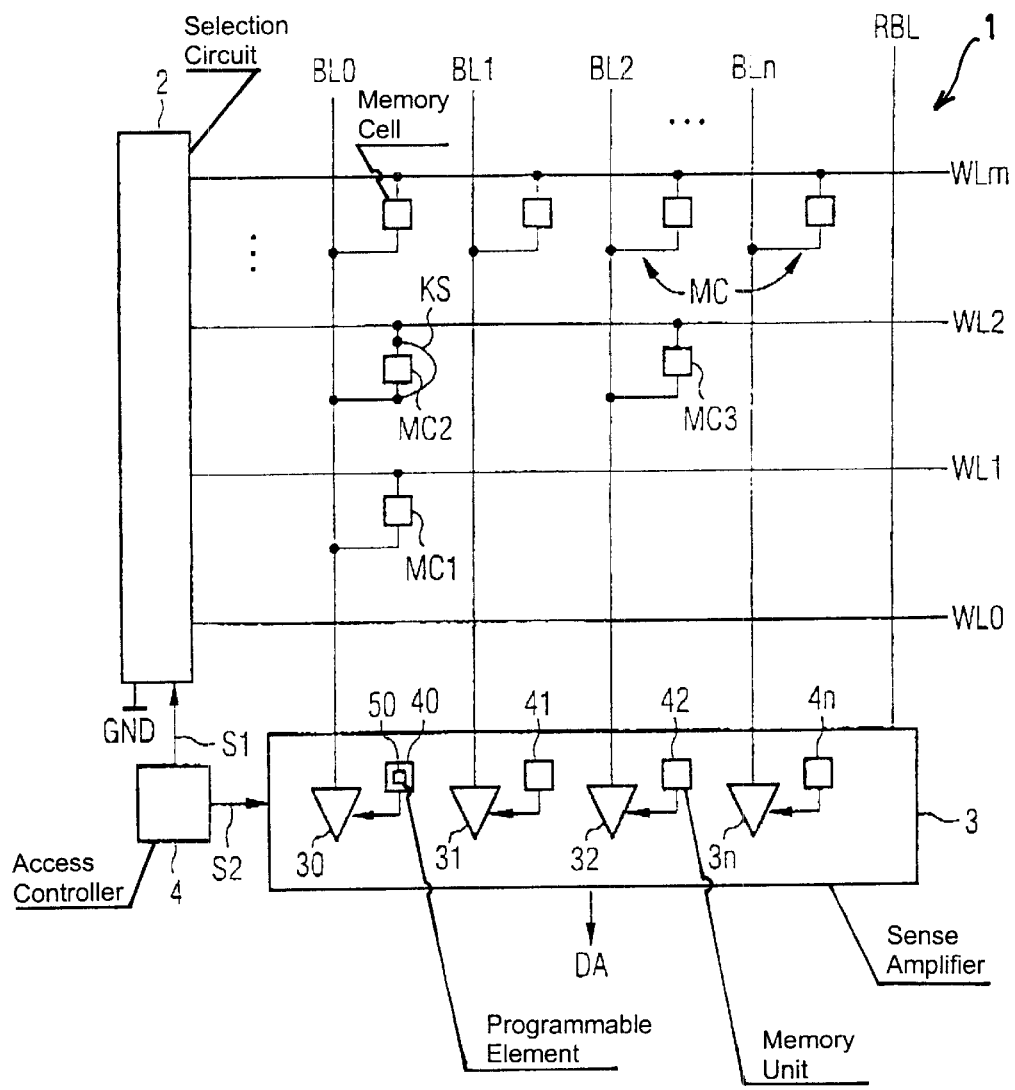

INTEGRATED MEMORY HAVING MEMORY CELLS WITH A MAGNETORESISTIVE STORAGE PROPERTY

BACKGROUND OF THE INVENTION

Field of the Invention

The present invention relates to an integrated memory having memory cells with a magnetoresistive storage property. The memory cells are in each case connected between one of a plurality of column lines and one of a plurality of row lines. The column lines are connected to a sense amplifier and the row lines can in each case be connected to a terminal for a selection signal for reading a data signal of one of the memory cells or writing a data signal to one of the memory cells via the column line connected to the memory cell.

Memory cells with a magnetoresistive storage effect generally have variable-state ferromagnetic layers for storing data signals. This storage effect is generally referred to as the GMR (giant magnetoresistive) effect or TMR (tunneling magnetoresistive) effect. In this case, the electrical resistance of such a memory cell is dependent on the magnetization of the ferromagnetic layers.

Integrated memories having memory cells of this type, also referred to as MRAMs (Magnetoresistive Random Access Memory), are often of a similar structure to that of, for example, integrated memories of the DRAM (Dynamic Random Access Memory) type. Memories of this type generally have a memory cell configuration with row lines and column lines which run essentially parallel to one another, with the row lines usually running transversely with respect to the column lines.

A MRAM memory of this type is known from International Publication No. WO 99/14760. There, the memory cells are connected in each case between one of the row lines and one of the column lines and are electrically connected to the respective column line and row line. The memory cells with a magnetoresistive storage effect have in this case a higher impedance than the row lines and column lines. The row lines are in each case connected to a terminal for a selection signal for reading a data signal of one of the memory cells or writing a data signal to one of the memory cells via the column line connected to the memory cell. For the reading of a data signal of one of the memory cells, the column lines are connected to a sense amplifier. For reading, the current which can be detected on the column line is measured.

In the case of a MRAM memory of this type, there are no diodes or transistors to connect the memory cells to the respective column line for reading or writing a data signal in response to being addressed. This achieves advantages, in particular in terms of the geometrical configuration of the memory cells.

As a result of production-induced influences, such as for example process variations, or as a result of aging, it is possible that some of the memory cells have an undesired comparatively low resistance and are consequently defective. Defective memory cells of this type essentially have the effect of short-circuiting respective connected column lines and row lines. Such a short-circuit also affects other memory cells along this column line or row line. Furthermore, a short-circuit through one of the memory cells can have the effect that other memory cells which lie along affected lines can no longer be tested in a function test. When a memory with a defective memory cell is repaired, the problem cannot be rectified by replacing a single affected row line or column line, since the memory cells of the other affected line continue to be impaired in their function by the short-circuit. Furthermore, the persisting short-circuit also causes parasitic currents on other lines, possibly adversely influencing a reading or writing operation. Therefore, in this case both affected lines of a defective memory cell must be replaced.

SUMMARY OF THE INVENTION

It is accordingly an object of the invention to provide an integrated memory which overcomes the above-mentioned disadvantages of the heretofore-known memory devices of this general type and which, in the case of a defective memory cell, which causes a short-circuit between a row line and a column line, allows a largely proper reading of data signals from or writing of data signals to the remaining memory cells.

With the foregoing and other objects in view there is provided, in accordance with the invention, an integrated memory, including:

a plurality of column lines;

a plurality of row lines;

memory cells each connected between a respective one of the column lines and a respective one of the row lines, the memory cells having a magnetoresistive storage property;

a sense amplifier connected to the column lines;

a terminal for providing a selection signal;

the row lines respectively being connectable to the terminal in order to selectively read a data signal from a selected one of the memory cells and write a data signal to the selected one of the memory cells via one of the column lines connected to the selected one of the memory cells; and a control device controlling the sense amplifier such that at least one of the column lines not connected to the selected one of the memory cells and connected to at least one defective one of the memory cells causing a short-circuit between in each case one of the row lines and one of the column lines is electrically isolated in the sense amplifier for selectively reading and writing the data signal.

In the case of the integrated memory according to the invention, it is possible, when defective memory cells occur, causing a short-circuit between the respective connected row line and column line, to disconnect the affected column line in the sense amplifier in such a way that the corresponding connected row line can continue to be operated. The row line connected to a defective memory cell can, for example, continue to be used for normal operation or test operation of the integrated memory. Since the corresponding column line has a kind of floating state in the sense amplifier after the disconnection, it can be brought to the potential of the row line connected to the defective memory cell via the short-circuited memory cell. As a result, a reading operation or writing operation via the affected row line is no longer adversely influenced by the defective memory cell. The effort required for disconnecting the affected column line in the sense amplifier is relatively low in this case. For a possible repair, it is only necessary to replace the affected column line.

In one embodiment of the memory according to the invention, the column lines are connected to a respective driver circuit, which can be operated in a conducting state or nonconducting state. These driver circuits can be used to drive the column lines in such a way that they are electrically isolated for the reading or writing of the data signal. For this purpose, the driver circuits are operated in the nonconducting state. The respective driver circuit has, for example, switching devices in the form of transistors which are connected to the respective column line via their source-drain paths. These transistors are operated in a corresponding nonconducting state.

According to another feature of the invention, the respective driver circuit is assigned a memory unit, by which the respective driver circuit can be driven. An item of information, for example which of the column lines are in each case connected to a defective memory cell, can be stored in the respective memory unit. The respective memory unit in this case generates a corresponding control signal for the respective assigned driver circuit. The memory units have, for example, in each case an element which can be programmed electrically or can be programmed by an energy beam. The latter may be configured for example in the form of a laser fuse, which can be programmed through the use of a laser beam. The information to be stored can be permanently stored by programmable elements of this type, so that a function test for the detection of defective memory cells only has to be carried out once.

For the repair of defective memory cells, the integrated memory preferably has redundant memory cells, which are combined to form at least one redundant column line, which can replace, in terms of its address, a regular column line having defective memory cells. In this case, the integrated memory is checked, for example by an external checking device, and a programming of the redundant elements is subsequently performed on the basis of a redundancy analysis. A redundancy circuit then has programmable elements, for example in the form of programmable fuses, which serve for storing the address of a line to be replaced.

For the repair of the integrated circuit in the case of a defective memory cell, it is sufficient to replace only the affected column line by a redundant column line. Since the column line affected by the short-circuit is electrically isolated in the sense amplifier during the reading or writing, the affected row line can continue to be operated. As a result, the repair effort can be advantageously reduced.

If the integrated memory has a plurality of redundant row lines and column lines, in the case of a defective memory cell it is possible to continue with a function test for the remaining memory cells if the column line connected to the defective memory cell is first of all isolated. In this way, a large number of memory cells of the integrated memory can be tested, even if in the meantime defective memory cells occur. This has the advantage that a specifically selective optimized programming of the redundant lines can be performed on the basis of a subsequent redundancy analysis. Since the number of redundant lines is usually limited, the yield of integrated memories to be produced can be increased in this way.

Other features which are considered as characteristic for the invention are set forth in the appended claims.

Although the invention is illustrated and described herein as embodied in a integrated memory having memory cells with magnetoresistive storage effect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a schematic circuit diagram of a memory configuration according to the invention.

DESCRIPTION OF THE PREFERRED EMBODIMENTS

Referring now to the single FIGURE, the invention is explained in more detail. The figure shows an exemplary embodiment of a MRAM memory having memory cells MC with a magnetoresistive storage effect. All known GMR/TMR elements are suitable as memory cells, as long as they have a higher impedance than the column lines and row lines. Here, the column lines are designated as bit lines BL0 to BLn, the row lines as word lines WL0 to WLm. The number of word lines and bit lines which the memory has here is given by way of example. The memory cells MC (MC1, MC2, MC3, . . . ), which are provided in a memory cell array 1 in the form of a matrix, are in each case connected between one of the bit lines BL0 to BLn and one of the word lines WL0 to WLm.

For writing an item of information or a data signal to one of the memory cells MC, the corresponding connected bit line and word line are connected to a respective current source, which is not represented in the figure. The currents flowing in the corresponding lines have the effect of producing at the crosspoint of the lines at which the memory cell MC concerned is provided a resulting superposed magnetic field, which causes a magnetic layer of the memory cell concerned to assume a specific state. The memory cell has in this case a magnetic hysteresis.

For reading a data signal from one of the memory cells MC, the corresponding bit line is connected to the sense amplifier or read amplifier 3. For reading, the word line concerned is driven by the row selection circuit 2 and has a predetermined selection signal or selection potential, for example a reference voltage GND=0V, applied to it via switching devices, so that a current flow occurs through the memory cell intended for reading. All the other word lines and respective bit lines are connected to a potential of, for example, V1=0.5V. The current flow through the memory cell is detected by the sense amplifier 3 on the corresponding bit line.

The memory cell MC2 shown in the figure is connected to the word line WL2 and bit line BL0. The memory cell MC2 shall be assumed to be defective. The bit line BL0 and the word line WL2 are short-circuited via the memory cell MC2, schematically represented in the figure by a short-circuit arc KS. If the short-circuit persists, for example during normal operation of the memory, a reading operation cannot be properly performed in the operating mode described above when memory cells along the word line WL2 are selected: for example, for reading a data signal of the memory cell MC2, the word line WL2 is connected to the selection potential GND=0V. The other word lines WL0, WL1 and WLm are connected to the potential V1=0.5V. Similarly, the bit lines BL0 to BLn are connected to the potential V1=0.5V. The potential level of the word line WL2 is changed by the short-circuited memory cell MC2. This potential level will level out at a value between 0V and 0.5V, dependent on the remaining resistance value of the memory cell MC2. If, in this case, an item of information of the memory cell MC3 is to be read, a current flow to be detected by the sense amplifier 3 may be falsified as a result of the changed potential level. In this case, a proper reading operation in respect of the memory cell MC3 is not possible.

In this case, it is not sufficient to replace the bit line BL0 by a redundant bit line. Since the word line WL2 and bit line BL0 continue to be short-circuited, a reading operation cannot be properly performed along the word line WL2. In this case, the word line WL2 must likewise be replaced by a redundant word line. This has the consequence that, for example, the memory cell MC3 can no longer be read from or written to via the bit line BL2.

The selection circuit 2 and the sense amplifier 3 are driven by the access controller 4 as a control device, or rather by the signals S1 and S2 of the latter. As described, for reading the data signal DA of the memory cell MC3 via the bit line BL2 connected to the memory cell MC3, the row line WL2 is connected to the selection potential GND. According to the invention, the bit line BL0 affected by the short-circuit is driven in such a way that it is isolated in the sense amplifier 3 for the reading of the data signal DA of the memory cell MC3. This bit line consequently has a kind of floating state in the sense amplifier 3. For reading the data signal DA of the memory cell MC3, the bit line BL0 connected to the short-circuited memory cell MC2 is accordingly discharged via the memory cell MC2 to the potential GND=0V. As soon as this state is reached, the reading of the memory cell MC3 can take place via the bit line BL2. The word line WL2 or its potential level is no longer influenced at this time by the defective memory cell MC2.

Also shown in the figure is an embodiment of the sense amplifier 3. The bit lines BL0 to BLn are in each case connected to driver circuits 30 to 3n. The driver circuits 30 to 3n are of the same structure in this case. They have, for example, switching transistors which can be operated in a conducting state or in a nonconducting state. The driver circuits 30 to 3n allow, for example, the potential V1 to be applied to the bit lines BL0 to BLn. For this purpose, the driver circuits 30 to 3n or their switching transistors are in a corresponding conducting state. To electrically isolate the respective bit lines BL0 to BLn in the sense amplifier 3, the corresponding driver circuits 30 to 3n or their switching transistors are operated in a corresponding nonconducting state.

The respective driver circuits 30 to 3n are assigned respective memory units 40 to 4n. The driver circuits can in this case be driven by the memory units. The memory units 40 to 4n have, for example, in each case an electrically programmable element 50, in which an item of information to be stored can be permanently stored. For example, an appropriate item of information that the bit line BL0 has to be correspondingly isolated in the sense amplifier 3 during the reading of the data signal DA, since it is connected to the defective memory cell MC2, is stored in the memory unit 40.

The memory cells MC of the memory cell array 1 are, for example, tested in a function test with regard to their functional capability. If in this case a defective memory cell MC is found, the corresponding bit line can be driven in the way described. As a result, the memory cell array 1 can be completely tested without a reading operation or writing operation being adversely influenced by a short-circuit. If a defective memory cell MC occurs, an affected bit line BL0 to BLn can be replaced by the shown redundant bit line RBL. During a repair with the redundant bit line RBL, only the affected bit line (in the example the bit line BL0) need be replaced.

I claim:

1. An integrated memory, comprising:
   a plurality of column lines;
   a plurality of row lines;
   memory cells each connected between a respective one of said column lines and a respective one of said row lines, said memory cells having a magnetoresistive storage property;
   a sense amplifier connected to said column lines;
   a terminal for providing a selection signal;
   said row lines respectively being connectable to said terminal in order to selectively read a data signal from a selected one of said memory cells and write a data signal to said selected one of said memory cells via one of said column lines connected to said selected one of said memory cells; and
   a control device controlling said sense amplifier such that at least one of said column lines not connected to said selected one of said memory cells and connected to at least one defective one of said memory cells causing a short-circuit between in each case one of said row lines and one of said column lines is electrically isolated in said sense amplifier for selectively reading and writing the data signal.

2. The integrated memory according to claim 1, including a plurality of driver circuits each connected to a respective one of said column lines, said driver circuits selectively being operated in a conducting state and a nonconducting state.

3. The integrated memory according to claim 2, including a plurality of memory units each operatively connected to a respective one of said driver circuits for controlling said driver circuits.

4. The integrated memory according to claim 3, wherein each of said memory units includes at least one electrically programmable element.

5. The integrated memory according to claim 3, wherein each of said memory units includes at least one energy-beam-programmable element.

6. The integrated memory according to claim 1, including at least one redundant column line provided for replacing one of said column lines.

* * * * *